(12) United States Patent
Wu

(10) Patent No.: US 12,184,233 B2
(45) Date of Patent: Dec. 31, 2024

(54) AMPLITUDE REGULATOR FOR CRYSTAL OSCILLATOR

(71) Applicant: Nordic Semiconductor ASA, Trondheim (NO)

(72) Inventor: Hsin-Ta Wu, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 18/037,648

(22) PCT Filed: Nov. 19, 2021

(86) PCT No.: PCT/EP2021/082356
§ 371 (c)(1),
(2) Date: May 18, 2023

(87) PCT Pub. No.: WO2022/106649
PCT Pub. Date: May 27, 2022

(65) Prior Publication Data
US 2024/0022210 A1    Jan. 18, 2024

(30) Foreign Application Priority Data
Nov. 19, 2020  (GB) .................................... 2018192

(51) Int. Cl.
*H03B 5/36* (2006.01)
*G05F 3/24* (2006.01)
(Continued)

(52) U.S. Cl.
CPC ............ *H03B 5/364* (2013.01); *G05F 3/242* (2013.01); *G05F 3/262* (2013.01); *H03B 5/04* (2013.01);
(Continued)

(58) Field of Classification Search
CPC .. H03B 5/364; H03B 5/04; H03B 2200/0012; H03B 2200/0062; H03B 2201/031; H03B 5/36; G05F 3/242; G05F 3/262
(Continued)

(56) References Cited

U.S. PATENT DOCUMENTS 5,905,412 A    5/1999  Rasmussen
5,923,222 A *  7/1999  Russell ................ H03K 3/3545
                                                        331/74
(Continued)

FOREIGN PATENT DOCUMENTS

EP    2 439 842        4/2012
EP    2720371 A1       4/2014
EP    3 499 719        6/2019

OTHER PUBLICATIONS

IPO Search Report under Section 17(5) for GB2018192.1, mailed Jan. 4, 2021, 3 pages.
(Continued)

Primary Examiner — Arnold M Kinkead
(74) Attorney, Agent, or Firm — Klarquist Sparkman, LLP

(57) ABSTRACT

An amplitude regulator circuit portion is arranged to supply a current to an inverter in an oscillator circuit. The regulator monitors a voltage at the input terminal of the inverter and varies the current supplied to the inverter in response to the monitored voltage. The amplitude regulator comprises first, second, and third PMOS transistors, and first and second NMOS transistors and is arranged such that an input node is connected to the input terminal of the inverter, a respective gate terminal of each of the first and second NMOS transistors, and a respective drain terminal of the first NMOS and first PMOS transistors. The amplitude regulator also comprises a back-bias circuit portions arranged to vary a back-bias voltage at a back-gate terminal of the second
(Continued)

NMOS transistor, to vary a threshold voltage, where the threshold voltage of the second NMOS transistor is lower than that of the first NMOS transistor.

14 Claims, 3 Drawing Sheets

(51) Int. Cl.
  *G05F 3/26*  (2006.01)
  *H03B 5/04*  (2006.01)
(52) U.S. Cl.
  CPC ............... *H03B 2200/0012* (2013.01); *H03B 2200/0062* (2013.01)
(58) Field of Classification Search
  USPC .................. 331/175, 158, 116 FE, 183, 185
  See application file for complete search history.

(56) References Cited

U.S. PATENT DOCUMENTS

| | | | |
|---|---|---|---|
| 7,868,710 B1 | 1/2011 | Farahvash | |
| 8,816,786 B2* | 8/2014 | Tham | H03B 5/06 331/109 |
| 9,054,637 B1 | 6/2015 | Mittal et al. | |
| 9,344,036 B1 | 5/2016 | Chang | |
| 2006/0017598 A1 | 1/2006 | Hales et al. | |
| 2006/0119447 A1 | 6/2006 | Hagino | |
| 2006/0164178 A1 | 7/2006 | Matsuura | |
| 2007/0188256 A1 | 8/2007 | Maheshwari | |
| 2008/0048795 A1 | 2/2008 | Hoshino | |
| 2009/0261914 A1 | 10/2009 | Kao et al. | |
| 2011/0037524 A1 | 2/2011 | Dao | |
| 2014/0091869 A1 | 4/2014 | Tham | |
| 2014/0210565 A1* | 7/2014 | Vilas Boas | H03L 5/00 331/158 |
| 2015/0061786 A1 | 3/2015 | Mai | |
| 2015/0180410 A1 | 6/2015 | Yamamoto | |
| 2020/0177127 A1 | 6/2020 | Hao | |
| 2020/0244223 A1 | 7/2020 | Yamamoto | |
| 2021/0273610 A1 | 9/2021 | Telsto | |

OTHER PUBLICATIONS

International Search Report and Written Opinion for PCT/EP2021/082356, mailed Mar. 14, 2022, 13 pages.

* cited by examiner

AMPLITUDE REGULATOR FOR CRYSTAL OSCILLATOR

CROSS REFERENCE TO RELATED APPLICATIONS

This is the U.S. National Stage of International Application No. PCT/EP2021/082356, filed Nov. 19, 2021, which was published in English under PCT Article 21(2), which in turn claims the benefit of Great Britain Application No. 2018192.1, filed Nov. 19, 2020.

TECHNICAL FIELD

The present invention relates to an amplitude regulator suitable for use with oscillator circuits, particularly but not exclusively an amplitude regulator for use with a Pierce oscillator.

BACKGROUND

It is a common aim in modern electronic devices to provide a signal having a particular frequency, for example to be used as a clock signal for timing events within other parts of the circuit. An electronic oscillator is an electronic circuit that produces a periodic, oscillating electronic signal, often a sine wave or a square wave.

An oscillator that provides a sinusoidal signal is referred to in the art as a linear oscillator. Typically, a linear oscillator is constructed from an amplifier (e.g. a transistor or operational amplifier) provided with feedback such that its output is fed back into its input through a frequency selective filter in order to provide positive feedback. On powering up, noise in the circuit provides a non-zero signal and this noise is amplified by the feedback loop and filtered until it converges on a sine wave at a single frequency. This generally occurs fairly quickly after powering up the circuit.

Linear oscillators include resistor-capacitor (RC) oscillator circuits, which use a network of resistors and capacitors as the filter; inductor-capacitor (LC) oscillator circuits, which use a network of inductors and capacitors as the filter, and crystal oscillator circuits, which use a piezoelectric crystal (e.g. a quartz crystal) as the filter. It is understood in the art that such crystals may have a relatively high Q-factor and also better temperature stability than tuned circuits, so crystal oscillators have much better frequency stability than LC or RC oscillators.

Some such crystal oscillator circuits, for example those based on the arrangement described in "High-Performance Crystal Oscillator Circuits: Theory and Application," E. A. Vittoz et al., IEEE JSSC June 1988, may use an amplitude regulator circuit to generate the current which is supplied to a so-called 'Pierce inverter' which drives the crystal, where such an arrangement is often referred to as a 'Pierce oscillator'. The amplitude regulator circuit portion limits the current supplied to the Pierce inverter—referred to herein as the 'Pierce current (IPIERCE)—such that the gain is just above the level where oscillations are maintained, where this threshold is referred to as I_threshold. The amplitude regulator is provided with a feedback loop such that the current can be maintained at the appropriate level.

In some arrangements, it is desirable for the amplitude regulator to be switched off once the voltage Vamp_XC1 at the input of the crystal reaches the desired level to improve power efficiency. This is particularly, though not exclusively, applicable to arrangements in which a further current supply is used alongside the amplitude regulator. For example, in some arrangements, the amplitude regulator is provided alongside a 'low noise' current digital-to-analogue converter (DAC) or 'IDAC' to drive the crystal to oscillation.

The Applicant has appreciated that it would be desirable to provide better tuning of when the amplitude regulator is switched off in order to achieve further improvements to the power efficiency and phase noise of the device.

SUMMARY OF THE INVENTION

When viewed from a first aspect, the present invention an electronic device comprising:
  an oscillator circuit portion comprising an inverter having an input terminal and an output terminal, said oscillator circuit portion further comprising a crystal oscillator connected between the input and output terminals of the inverter;
  an amplitude regulator circuit portion arranged to supply a current to the inverter of the oscillator circuit portion, said amplitude regulator being arranged to monitor a voltage at the input terminal of the inverter and to vary the current supplied to said inverter in response to said monitored voltage;
  wherein the amplitude regulator comprises first, second, and third PMOS transistors, and first and second NMOS transistors, said amplitude regulator being arranged such that:
  an input node of the amplitude regulator is connected to the input terminal of the inverter, a respective gate terminal of each of the first and second NMOS transistors, and a respective drain terminal of each of the first NMOS transistor and first PMOS transistor;
  a drain terminal of the second NMOS transistor is connected to a drain terminal of the second PMOS transistor;
  a respective source terminal of each of the first, second, and third PMOS transistors is connected to a positive supply rail;
  a respective source terminal of each of the first and second NMOS transistors is connected to a negative supply rail or ground, wherein the source terminal of the second NMOS transistor is connected to the negative supply rail or ground via a trimming resistor;
  a respective gate terminal of each of the first, second, and third PMOS transistors are connected together and to the respective drain terminals of the second PMOS transistor and second NMOS transistor; and
  a drain terminal of the third PMOS transistor is connected to a current input of the inverter of the oscillator circuit portion;
  wherein the amplitude regulator further comprises a back-bias circuit portion arranged to vary a back-bias voltage at a back-gate terminal of the second NMOS transistor, thereby varying a threshold voltage of said second NMOS transistor; and
  wherein the threshold voltage of the second NMOS transistor is lower than the threshold voltage of the first NMOS transistor.

The amplitude regulator is also novel and inventive in its own right and thus the first aspect of the invention extends to an amplitude regulator circuit portion for supplying a current to an inverter of an oscillator circuit portion, said amplitude regulator comprising first, second, and third PMOS transistors, and first and second NMOS transistors, wherein said amplitude regulator is arranged such that:
  an input node of the amplitude regulator is connected to the input terminal of the inverter, a respective gate terminal of each of the first and second NMOS transistors, and a respective drain terminal of each of the first NMOS transistor and first PMOS transistor;

a drain terminal of the second NMOS transistor is connected to a drain terminal of the second PMOS transistor;

a respective source terminal of each of the first, second, and third PMOS transistors is connected to a positive supply rail;

a respective source terminal of each of the first and second NMOS transistors is connected to a negative supply rail or ground, wherein the source terminal of the second NMOS transistor is connected to the negative supply rail or ground via a trimming resistor;

a respective gate terminal of each of the first, second, and third PMOS transistors are connected together and to the respective drain terminals of the second PMOS transistor and second NMOS transistor; and a drain terminal of the third PMOS transistor is connected to a current input of the inverter of the oscillator circuit portion;

wherein the amplitude regulator further comprises a back-bias circuit portion arranged to vary a back-bias voltage at a back-gate terminal of the second NMOS transistor, thereby varying a threshold voltage of said second NMOS transistor; and wherein the threshold voltage of the second NMOS transistor is lower than the threshold voltage of the first NMOS transistor.

Thus it will be appreciated that embodiments of the present invention provide an improved electronic device in which the amplitude regulator that supplies the current to the oscillator circuit (e.g. a Pierce oscillator) utilises 'back-biasing' in order to turn off the amplitude regulator at the point at which the amplitude of the voltage at the input of the inverter (i.e. at the input of the crystal) reaches the desired value. By adjusting the back-bias voltage supplied to the back-gate of the second NMOS transistor, its threshold voltage can be adjusted so as to turn the amplitude regulator off when the amplitude of the oscillations reaches the desired level.

Even after adjustments are made to the threshold voltage of the second NMOS transistor, it must be lower than the threshold voltage of the first NMOS transistor for the behaviour outlined above to be exhibited. Thus adjusting the back-bias voltage supplied to the back-gate of the second NMOS transistor varies a difference between the respective threshold voltages of the first and second NMOS transistors.

As will be appreciated by those skilled in the art, the back-gate terminal of a transistor provides control over the threshold voltage of that transistor. While the principles of the present invention may be applicable to any suitable transistor technology that provides for back-biasing, in at least some embodiments, the transistors comprise semiconductor-on-insulator (SOI) devices, and may comprise fully-depleted semiconductor-on-insulator (FD-SOI) devices. Unlike conventional bulk complementary metal-oxide-semiconductor (CMOS) technology in which devices are manufactured from silicon substrates, 'silicon-on-insulator' (SOI) devices are manufactured from layers of silicon stacked on an insulating layer, typically silicon dioxide or sapphire. SOI devices can be manufactured through 'partial depletion' (PDSOI) or 'full depletion' (FDSOI), where 'partial' and 'full' refer to the degree to which the depletion region extends through the bulk of the device. SOI enables the usage of transistor back bias and which may provide for a reduction in transistor leakage or make transistors faster, depending on the type of back bias in use. A forward back bias may lead to faster transistors (but that leak more) whereas a reverse back bias may lead to transistors leaking less (but that are slower).

In some embodiments, the oscillator circuit portion comprises a Pierce oscillator, wherein the inverter comprises a Pierce inverter.

In some embodiments, a resistor may be connected between the source terminal of the second NMOS transistor and the negative supply rail or ground. In a set of such embodiments, the resistance of this resistor is variable. Providing such a 'trimmable' resistor at the source terminal of the second NMOS transistor may advantageously allow the amplitude regulator to be calibrated such that the relationship between the current supplied to the inverter and the amplitude of the voltage at the input terminal of the inverter is tuned to a particular operating point. Advantageously, providing this 'trimming' function may allow a wide range of crystals to be used in the oscillator circuit portion with the same amplitude regulator design.

While the resistor could be a single resistor, in a set of embodiments, a resistive arrangement comprising a plurality of resistors and a switching arrangement may be connected between the source terminal of the second NMOS transistor and the negative supply rail or ground, wherein the switching arrangement selectively enables a selection of said plurality of resistors thereby setting the resistance of said resistive arrangement. For example, the resistive arrangement may comprise a switched array or matrix of resistors.

A resistor may, at least in some embodiments, be connected between the gate and drain terminals of the first NMOS transistor. This resistor may help to set the DC condition for the first NMOS transistor, i.e. to set it to its operating point.

A first low pass filter arrangement may, at least in some embodiments, be connected between the input terminal of the amplitude regulator and the gate terminal of the second NMOS transistor. This low pass filter may be constructed from a first filter resistor and a first filter capacitor. This causes the conductance of the second NMOS transistor to be dependent on the time-average amplitude of the voltage at the input of the amplitude regulator (i.e. the input of the crystal in the crystal oscillator when connected), where the time-averaging is provided by the low pass filtering. This low pass filter also prevents high frequency fluctuations (e.g. due to noise) being applied to the gate terminal of the second NMOS transistor.

As outlined above, the second NMOS transistor is provided with a back-bias that allows the amplitude regulator to be turned off at the desired point. In some embodiments, the back-bias voltage may be set manually. In some embodiments, a back-bias voltage generator may be arranged to generate the back-bias voltage and to supply said back-bias voltage to the gate terminal of the second NMOS transistor. The back-bias voltage generator may be trimmed to produce the desired back-bias voltage.

However, in some embodiments the back-bias circuit portion is arranged to generate the back-bias voltage automatically. As outlined above, the input node of the amplitude regulator is connected to the back-gate terminal of the second NMOS transistor. While this connection could be direct, in some embodiments the input node of the amplitude regulator is connected to the back-gate terminal of the second NMOS transistor via a second low pass filter arrangement.

The back-bias voltage may also be 'trimmable'. The back-bias voltage may be generated using a current source which is fed into a variable resistance, e.g. a variable resistor or a programmable array of resistances. In a particular set of embodiments, both the resistance of the trimmable resistor, outlined above in respect of certain embodiments of the present invention, and the back-bias voltage are trimmable.

It will be appreciated that the term 'second' as used herein in respect of this low pass filter and its constituent components does not necessitate the inclusion of the 'first' low pass filter or any particular components thereof outlined above, and that these are designated as 'first' and 'second' for ease of reference only.

The second low pass filter arrangement may comprise a second filter resistor and a second filter capacitor that form an 'RC' network between the input of the amplitude regulator and the back-gate of the second NMOS transistor. In some such embodiments, the second low pass filter arrangement comprises a second filter resistor and a second filter capacitor arranged such that:
- a first terminal of the second filter resistor is connected to the drain nodes of the first PMOS transistor and first NMOS transistor;
- a second terminal of the second filter resistor is connected to the back-gate terminal of the second NMOS transistor and to a first terminal of the second filter capacitor; and
- a second terminal of the second filter capacitor is connected to the negative supply rail or ground.

It will be appreciated by those skilled in the art that a transistor typically has an associated 'aspect ratio', i.e. the ratio between the channel width and length of that transistor (W/L)—sometimes referred to in the art as the W/L ratio of the transistor. In some embodiments, a W/L ratio of the second NMOS transistor is greater than a W/L ratio of the first NMOS transistor. In some embodiments, the W/L ratio of the second NMOS transistor is four (or approximately four) times greater than the W/L ratio of the first NMOS transistor. In some other embodiments, the W/L ratio of the second NMOS transistor is eight (or approximately eight) times greater than the W/L ratio of the first NMOS transistor. In some potentially overlapping embodiments, the W/L ratio of the second PMOS transistor is substantially equal to the W/L ratio of the first PMOS transistor.

In embodiments in which a trimmable resistor is connected between the source terminal of the second NMOS transistor and the negative supply rail or ground, having the W/L value of the second NMOS transistor be approximately four times greater than the W/L value of the first NMOS transistor (i.e. N2:N1 is approximately 4:1) is particularly advantageous because it results in the transconductance of the amplitude regulator being dependent only on the resistance value of that resistor.

Generally, the current through the second NMOS transistor is equal to the magnitude of the difference between the gate-source voltage $V_{gs1}$ of the first NMOS transistor and the gate-source voltage $V_{gs2}$ of the second NMOS transistor, divided by the resistance $R_1$ of the trimmable resistor in accordance with Equation 1 below:

The current through the first and third transistors $$I_2 = \frac{|V_{gs1} - V_{gs2}|}{R_1} = \frac{\Delta V_{gs}}{R_1} = \frac{\Delta V_{od}}{R_1} = I_1 = I \quad \text{Equation 1}$$

where: I is the current, $I_1$ is the current through the first NMOS transistor, $I_2$ is the current through the second NMOS transistor, $V_{gs1}$ is the gate-source voltage of the first NMOS transistor, $V_{gs2}$ is the gate-source voltage of the second NMOS transistor, $\Delta V_{gs}$ is the difference in these gate-source voltages, $V_{od}$ is the difference between the gate-source voltage $V_{gs}$ and the threshold voltage $V_{th}$ for a given transistor (as outlined further below below) and thus $\Delta V_{od}$ is the difference between this value for the two NMOS transistors.

The transconductance $g_m$ is given as per Equation 2 below:

The transconductance of the current source

Equation 2

$$g_{m1} = \frac{2 \times I}{V_{od1}} = \frac{2(\Delta V_{od})}{(R1 \times V_{od1})} = (2 \times R1) \times \left(1 - \frac{V_{od2}}{V_{od1}}\right) = \frac{2}{R1}\left(1 - \frac{1}{\sqrt{m}}\right)$$

where: $g_{m1}$ is the transconductance of the first NMOS transistor, $V_{od1}$ is the difference between the respective gate-source voltage $V_{gs}$ and the threshold voltage $V_{th}$ of the first NMOS transistor, $V_{od2}$ is the difference between the respective gate-source voltage $V_{gs}$ and the threshold voltage $V_{th}$ of the second NMOS transistor, and m is the factor by which the aspect ratio W/L of the second NMOS transistor is greater than the aspect ratio W/L of the first NMOS transistor.

By using Equation 3 below:

Relationship between the output voltages and the factor m $$\frac{V_{od2}}{V_{od1}} = \sqrt{\frac{W1}{W2}} = \frac{1}{\sqrt{(m)}} \quad \text{Equation 3}$$

and setting m to 4, then the transconductance of the first NMOS transistor $$g_{m1} = \frac{1}{R1},$$

and thus the transconductance $g_{m1}$ depends only on the resistance value $R_1$ of the trimmable resistor, thereby providing the constant-$g_m$ function of the current source for IPIERCE.

It has, however, been appreciated that setting m to 8 (i.e. to make N2:N1 approximately equal to 8:1), particularly in combination with a trimmed resistance of the resistor between the source terminal of the second NMOS transistor and the negative supply rail or ground, and an automatically trimmed value of the back-bias voltage may lead to improved performance.

BRIEF DESCRIPTION OF DRAWINGS

Certain embodiments of the invention will now be described, by way of example only, with reference to the accompanying drawings in which.

DETAILED DESCRIPTION

Figure 1:
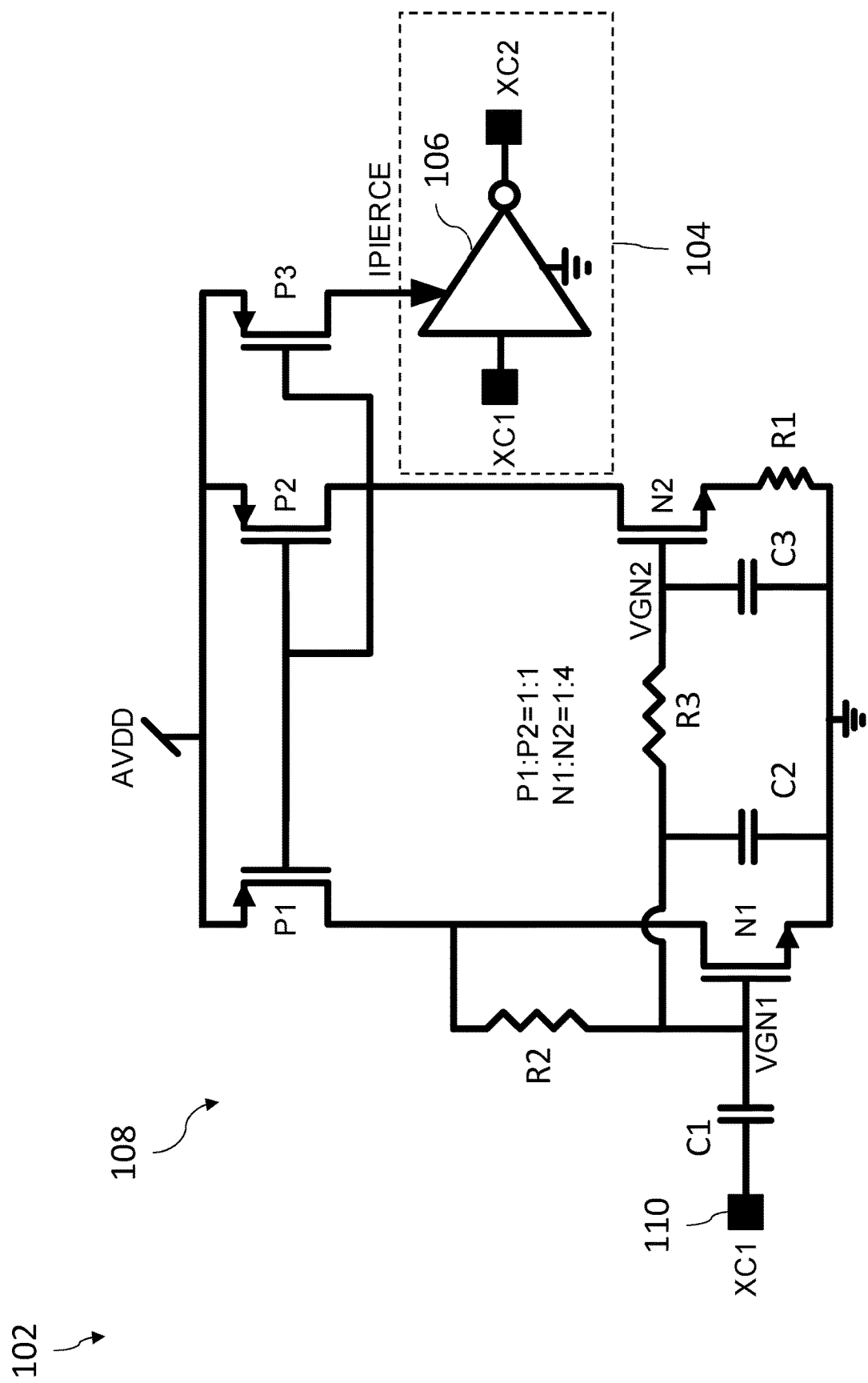
FIG. 1 is a circuit diagram of an electronic device including a typical amplitude regulator for use with a Pierce oscillator.

FIG. 1 is a circuit diagram of an electronic device 102 including a typical amplitude regulator 108 for use with a Pierce oscillator 104.

The device 102 comprises an oscillator circuit portion which in this example is a Pierce oscillator 104. The Pierce oscillator 104 includes a Pierce inverter 106 having an input terminal XC1 and an output terminal XC2, where a crystal oscillator would be connected between the input terminal XC1 and output terminal XC2 of the inverter 106. The crystal oscillator and any other circuitry relating to the Pierce oscillator 104 are not shown in FIG. 1, however there are many suitable topologies known in the art per se.

The device 102 also includes an amplitude regulator circuit portion 108 which is arranged to supply a current IPIERCE to the inverter 106 within the Pierce oscillator 104. The amplitude regulator 108 is arranged to monitor the voltage at the input terminal of the inverter 106 and to vary the current IPIERCE supplied to the inverter 106 in response to that monitored voltage.

The amplitude regulator 108 comprises first, second, and third PMOS transistors P1-3, and first and second NMOS transistors N1, N2. It will be appreciated that these transistors are conventional metal-oxide-semiconductor (MOS) field-effect-transistors (FETs) or 'MOSFETs'. Each transistor has a respective gate, drain, and source terminal as is typical for such devices, and their respective connections are outlined below.

The respective source terminal of each of the first, second, and third PMOS transistors is connected to a positive supply rail AVDD, while the respective source terminal of each of the first and second NMOS transistors N1, N2 is connected to ground. In particular, the source terminal of the second NMOS transistor N2 is connected to ground via a fixed resistor R1.

An input node 110 of the amplitude regulator 108 is connected to the input terminal XC1 of the inverter 106, the respective gate terminal of each of the first and second NMOS transistors N1, N2, and the respective drain terminal of each of the first NMOS transistor N1 and first PMOS transistor P1. An 'AC coupling' capacitor C1 is connected between the input node 110 and the gate terminal of N1, such that the first terminal of C1 is connected to the input node 110 and the second terminal of C1 is connected to the gate of N1.

A further resistor R2 is connected between the gate and drain terminals of the first NMOS transistor N1, where this resistor R2 sets the DC condition for the first NMOS transistor, i.e. sets N2 to its operating point.

The respective gate terminals of each of the first, second, and third PMOS transistors P1-3 are connected together and to the respective drain terminals of the second PMOS transistor P2 and second NMOS transistor N2. As a result, the second PMOS transistor P2 is 'diode connected' (i.e. due to the connection between its drain and gate terminals).

The drain terminal of the third PMOS transistor P3 is connected to a current input of the inverter 106 of the oscillator circuit portion 104, and the gate terminal of P3 is connected to the gate terminal of P2 (and also the gate terminal of P1). Due to this arrangement, the second and third PMOS transistors P2, P3 form a current mirror, such that the current through the second PMOS transistor P2 is 'reflected' as the Pierce current IPIERCE supplied to the Pierce inverter 106. These two currents may be equal, or may be scaled in accordance with a ratio of the W/L values of P2 and P3, as per a technique for current mirror design known in the art per se.

The amplitude regulator 108 operates to monitor the voltage at the input terminal XC1 of the inverter 106, i.e. the voltage at the input of the crystal connected between XC1 and XC2 within the Pierce oscillator 104.

A low pass filter, constructed from a filter resistor R3 and a filter capacitor C3, is connected between the input terminal 110 of the amplitude regulator 108 and the gate terminal of the second NMOS transistor N2. This causes the conductance of the second NMOS transistor N2 to be dependent on the time-average amplitude of the voltage Vamp_XC1 at the input of the crystal in the crystal oscillator 104, where the time-averaging is provided by the low pass filtering. This low pass filter also prevents high frequency fluctuations (e.g. due to noise) being applied to the gate terminal of N2.

Thus while the amplitude of the voltage Vamp_XC1 at the input of the crystal in the crystal oscillator 104 remains below a certain value, which is set through the choice of component values of the resistor R1, N2 is relatively conductive, which causes a current to pass through the diode-connected second PMOS transistor P2. Due to the current mirror formed by P2 and P3, this current is then reflected through P3 as the Pierce current IPIERCE that is provided to the inverter 106 as outlined above.

As the amplitude of the voltage Vamp_XC1 at the input of the crystal in the crystal oscillator 104 ramps up, it will eventually reach approximately the desired cut-off level and the conductance of N2 is reduced, thereby reducing the Pierce current IPIERCE.

Figure 2:
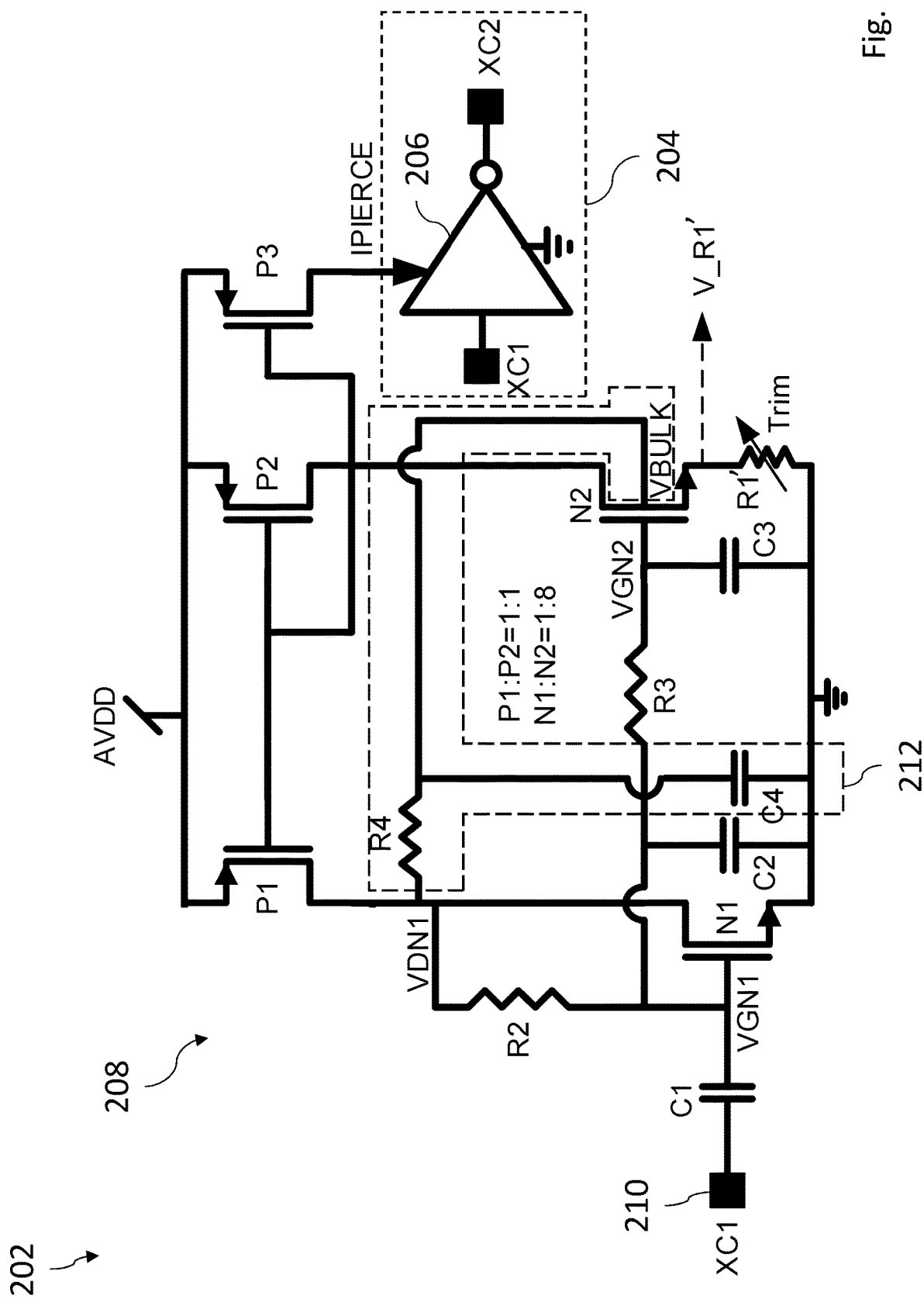
FIG. 2 is a circuit diagram of an electronic device including an amplitude regulator for use with a Pierce oscillator in accordance with an embodiment of the present invention.

FIG. 2 is a circuit diagram of an electronic device 202 including an amplitude regulator 208 for use with a Pierce oscillator 204 in accordance with an embodiment of the present invention. Portions of the circuit having a reference number starting with a '2' correspond in form and function to the portions having corresponding numbers starting with a '1' as outlined above in respect of FIG. 1, except where specified otherwise below.

The structure of the amplitude regulator 208 corresponds to the amplitude regulator 108 of FIG. 1, however the amplitude regulator 208 in accordance with an embodiment of the present invention has some additional features that, as is outlined below, provide for a 'tighter tuning' of the amplitude regulation loop, enabling the amplitude regulator 208 to be turned off more precisely.

In the arrangement of FIG. 2, the transistors P1-3, N1-2 are four-terminal transistors that have a so-called tack-bias' voltage applied to a back-gate terminal. Those skilled in the art will appreciate that the provision of a suitable back-bias voltage to such a transistor causes a shift in the threshold voltage of that transistor. As explained in further detail below, this is of particular interest in respect of the second NMOS transistor N2. There are a number of suitable four-terminal transistors, known in the art per se, that can be used for these transistors P1-3, N1-2, e.g. FDSOI devices.

The amplitude regulator 208 of FIG. 2 further comprises a back-bias circuit portion 212 which is arranged to vary the back-bias voltage VBULK applied to the back-gate terminal of the second NMOS transistor N2, thereby varying the threshold voltage of the second NMOS transistor N2.

In particular, the back-bias circuit portion 212 includes a second low pass filter arrangement constructed from a filter resistor R4 and a filter capacitor C4. The second filter resistor R4 and second filter capacitor C4 form an 'RC' network between the input terminal 210 of the amplitude regulator and the back-gate of the second NMOS transistor.

The first terminal of the second filter resistor R4 is connected to the drain nodes of the first PMOS transistor P1 and first NMOS transistor N1; and the second terminal of the second filter resistor R4 is connected to the back-gate terminal of the second NMOS transistor N2. The first terminal of the second filter capacitor C4 is connected to the node between the second terminal of the second filter resistor R4 and the back-gate terminal of the second NMOS transistor N2; and the second terminal of the second filter capacitor C4 is connected to ground.

Thus the input terminal 210 of the amplitude regulator 208 is connected to the back-gate terminal of the second NMOS transistor N2 via this second low pass filter R4, C4 such that the voltage VBULK applied to the back-gate terminal of N2 is a low pass filtered version of the voltage VDN1 at the drain terminal of N1, where the low pass filter function is provided by the second low pass filter R4, C4.

A further change is that the fixed resistor R1 used in the amplitude regulator 108 of FIG. 1 is replaced with a variable resistor R1' in the amplitude regulator 208 of FIG. 2. This 'trimmable' resistor R1' is arranged such that its resistance can be varied. In this particular example, the variable resistor R1' is constructed from a switched array of resistors, such that a suitable selection of the resistors in the array can be 'switched in' to set the overall resistance of the variable resistor R1' to a desired value suitable for a particular crystal being used in the crystal oscillator 204.

Thus the voltage VGN2 applied to the gate terminal of N2 is a low pass filtered version of the voltage VGN1 applied to the gate terminal of N1, where the low pass filter function is provided by the first low pass filter R3, C3.

Figure 3:
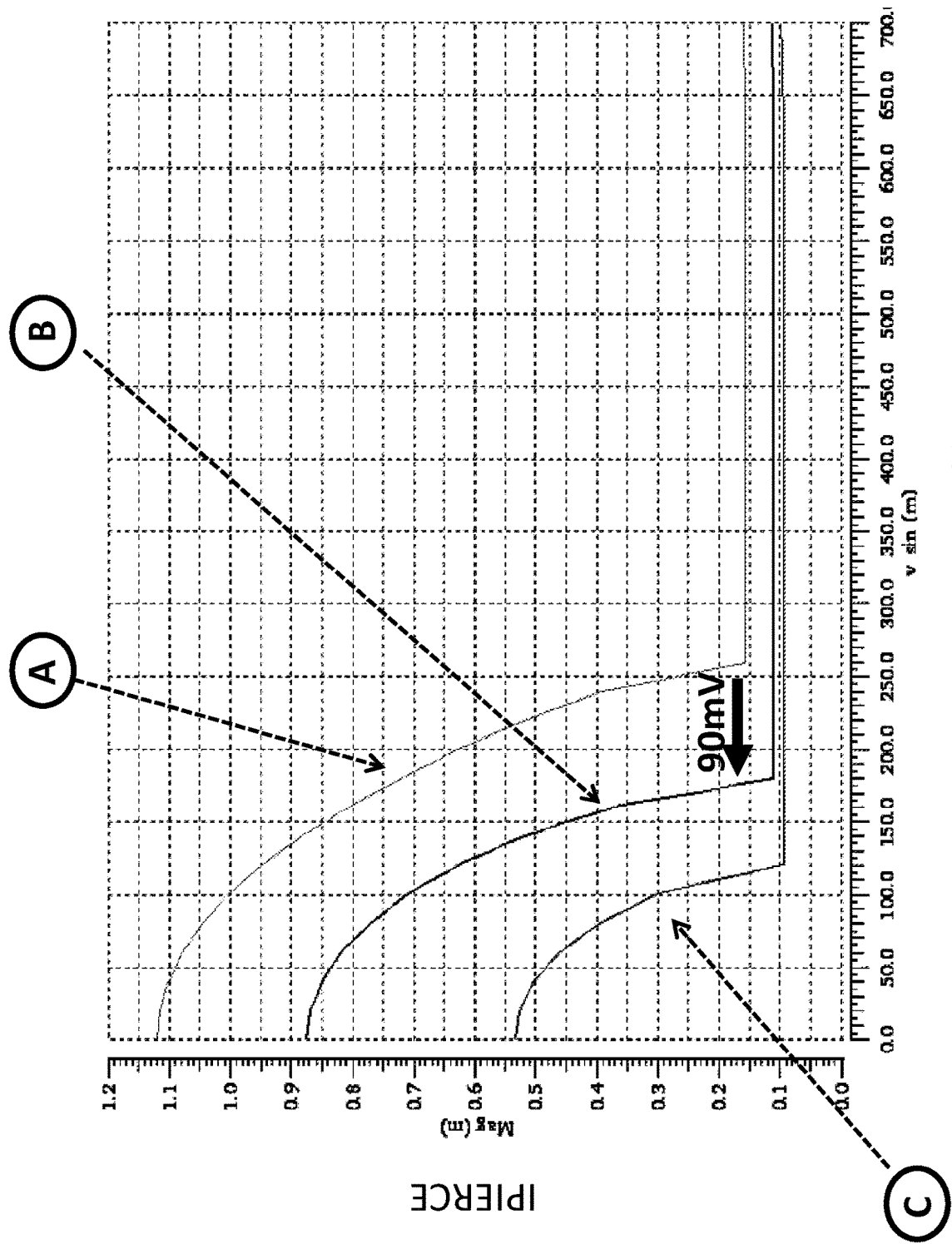
FIG. 3 is a graph illustrating operation of the device of FIG. 2.

FIG. 3 is a graph illustrating operation of the device 202 of FIG. 2. In particular, the graph of FIG. 3 shows three plots A-C illustrating the relationship between the current IPIERCE on the y-axis and the voltage Vamp_XC1 at the input to the crystal on the x-axis.

Plot A (i.e. the rightmost plot) shows the current-voltage relationship of the conventional device 102 of FIG. 1. As can be seen in plot A, the threshold of turning off the amplitude regulator is around Vamp_XC1=260 mV.

Plot C (i.e. the leftmost plot) shows the current-voltage relationship of a device in which back-gate biasing is used but in which the back-gate terminal of N2 is connected to R1 such that the back-bias voltage VBULK is equal to the voltage across R1. While such an approach does lead to a reduction in the threshold at which the amplitude regulator is switched off, the maximum current when Vamp_XC1=0 is significantly reduced and, as a result, may be too low for certain applications.

Plot B (i.e. the central plot) shows the current-voltage relationship of the device 202 of FIG. 2 in which the back-bias is applied to the back-gate terminal of N2 via the back-bias circuit portion 212 as outlined above. As can be seen from Plot B, this results in the threshold at which the amplitude regulator 208 is switched off is shifted down by approximately 90 mV (i.e. from 260 mV to 170 mV) compared to the conventional arrangement of Plot A, while still having a greater maximum current when Vamp_XC1=0 than where the back-bias is simply set to the voltage across R1 as in Plot C.

This is particularly beneficial when driving smaller form factor crystals. With less current driving the small crystal, a smaller Vamp_XC1 is expected. Thus in the example shown in FIG. 3, as long as Vamp_XC1 is bigger than 170 mV, the amplitude regulator 208 will be off without overall crystal phase noise performance degradation.

It will of course be appreciated that the examples shown in FIG. 3 and the specific voltages and currents are given as examples only and are not intended to be limiting on the scope of the claimed invention.

It can be seen, therefore, that embodiments of the present invention provide an improved electronic device in which the amplitude regulator for a crystal oscillator is turned off more sharply when the amplitude of the voltage at the input of the crystal reaches the desired value.

Those skilled in the art will appreciate that the specific embodiments described herein are merely exemplary and that many variants within the scope of the invention are envisaged.

The invention claimed is:

1. An electronic device comprising:
    an oscillator circuit portion comprising an inverter having an input terminal and an output terminal, said oscillator circuit portion further comprising a crystal oscillator connected between the input and output terminals of the inverter;
    an amplitude regulator circuit portion arranged to supply a current to the inverter of the oscillator circuit portion, said amplitude regulator being arranged to monitor a voltage at the input terminal of the inverter and to vary the current supplied to said inverter in response to said monitored voltage;
    wherein the amplitude regulator comprises first, second, and third PMOS transistors, and first and second NMOS transistors, said amplitude regulator being arranged such that:
    an input node of the amplitude regulator is connected to the input terminal of the inverter, a respective gate terminal of each of the first and second NMOS transistors, and a respective drain terminal of each of the first NMOS transistor and first PMOS transistor;
    a drain terminal of the second NMOS transistor is connected to a drain terminal of the second PMOS transistor;
    a respective source terminal of each of the first, second, and third PMOS transistors is connected to a positive supply rail;
    a respective source terminal of each of the first and second NMOS transistors is connected to a negative supply rail or ground, wherein the source terminal of the second NMOS transistor is connected to the negative supply rail or ground via a trimming resistor;
    a respective gate terminal of each of the first, second, and third PMOS transistors are connected together and to the respective drain terminals of the second PMOS transistor and second NMOS transistor; and
    a drain terminal of the third PMOS transistor is connected to a current input of the inverter of the oscillator circuit portion;
    wherein the amplitude regulator further comprises a back-bias circuit portion arranged to vary a back-bias voltage at a back-gate terminal of the second NMOS transistor, thereby varying a threshold voltage of said second NMOS transistor; and
    wherein the threshold voltage of the second NMOS transistor is lower than the threshold voltage of the first NMOS transistor.

2. The electronic device as claimed in claim 1, wherein the transistors comprise semiconductor-on-insulator (SOI) devices, optionally wherein the transistors comprise fully-depleted semiconductor-on-insulator (FD-SOI) devices.

3. The electronic device as claimed in claim 1, wherein the oscillator circuit portion comprises a Pierce oscillator, and the inverter comprises a Pierce inverter.

4. The electronic device as claimed in claim 1, wherein a resistor (R1) is connected between the source terminal of the second NMOS transistor and the negative supply rail or ground.

5. The electronic device as claimed in claim 4, wherein a resistance of the resistor (R1) is variable.

6. The electronic device as claimed in claim 5, wherein the resistor (R1) comprises a resistive arrangement comprising a plurality of resistors and a switching arrangement may be connected between the source terminal of the second NMOS transistor and the negative supply rail or ground, wherein the switching arrangement selectively enables a selection of said plurality of resistors thereby setting the resistance of said resistive arrangement.

7. The electronic device as claimed in claim 1, wherein a resistor (R2) is connected between the gate and drain terminals of the first NMOS transistor.

8. The electronic device as claimed in claim 1, wherein a first low pass filter arrangement is connected between the input terminal of the amplitude regulator and the gate terminal of the second NMOS transistor, optionally wherein the low pass filter is constructed from a first filter resistor (R3) and a first filter capacitor (C3).

9. The electronic device as claimed in claim 1, wherein the input node of the amplitude regulator is connected to the back-gate terminal of the second NMOS transistor via a second low pass filter arrangement.

10. The electronic device as claimed in claim 9, wherein the second low pass filter arrangement comprises a second filter resistor (R4) and a second filter capacitor (C4) that form an RC network between the input of the amplitude regulator and the back-gate of the second NMOS transistor.

11. The electronic device as claimed in claim 10, wherein the second low pass filter arrangement is arranged such that:
  a first terminal of the second filter resistor is connected to the drain nodes of the first PMOS transistor and first NMOS transistor;
  a second terminal of the second filter resistor is connected to the back-gate terminal of the second NMOS transistor and to a first terminal of the second filter capacitor; and
  a second terminal of the second filter capacitor is connected to the negative supply rail or ground.

12. The electronic device as claimed in claim 1, wherein a W/L ratio of the second NMOS transistor is approximately eight times greater than a W/L ratio of the first NMOS transistor.

13. The electronic device as claimed in claim 1, wherein a W/L ratio of the second PMOS transistor is substantially equal to a W/L ratio of the first PMOS transistor.

14. An amplitude regulator circuit portion for supplying a current to an inverter of an oscillator circuit portion, said amplitude regulator comprising first, second, and third PMOS transistors, and first and second NMOS transistors, wherein said amplitude regulator is arranged such that:
  an input node of the amplitude regulator is connected to the input terminal of the inverter, a respective gate terminal of each of the first and second NMOS transistors, and a respective drain terminal of each of the first NMOS transistor and first PMOS transistor;
  a drain terminal of the second NMOS transistor is connected to a drain terminal of the second PMOS transistor;
  a respective source terminal of each of the first, second, and third PMOS transistors is connected to a positive supply rail;
  a respective source terminal of each of the first and second NMOS transistors is connected to a negative supply rail or ground, wherein the source terminal of the second NMOS transistor is connected to the negative supply rail or ground via a trimming resistor;
  a respective gate terminal of each of the first, second, and third PMOS transistors are connected together and to the respective drain terminals of the second PMOS transistor and second NMOS transistor; and
  a drain terminal of the third PMOS transistor is connected to a current input of the inverter of the oscillator circuit portion;
  wherein the amplitude regulator further comprises a back-bias circuit portion arranged to vary a back-bias voltage at a back-gate terminal of the second NMOS transistor, thereby varying a threshold voltage of said second NMOS transistor; and
  wherein the threshold voltage of the second NMOS transistor is lower than the threshold voltage of the first NMOS transistor.

\* \* \* \* \*